United States Patent
Suzuki et al.

(10) Patent No.: US 7,442,911 B2
(45) Date of Patent: Oct. 28, 2008

(54) PHOTODECTOR INCLUDING PHOTODIODES HAVING IMPROVED DYNAMIC RANGE, S/N RATIO AND SPEED OF LIGHT DETECTION

(75) Inventors: Yasuhiro Suzuki, Hamamatsu (JP); Seiichiro Mizuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 111 days.

(21) Appl. No.: 10/540,748

(22) PCT Filed: Dec. 25, 2003

(86) PCT No.: PCT/JP03/16801

§ 371 (c)(1),
(2), (4) Date: May 12, 2006

(87) PCT Pub. No.: WO2004/059748

PCT Pub. Date: Jul. 15, 2004

(65) Prior Publication Data

US 2006/0261254 A1    Nov. 23, 2006

(30) Foreign Application Priority Data

Dec. 25, 2002  (JP) .............................. 2002-375130

(51) Int. Cl.
*G01T 1/24* (2006.01)
(52) U.S. Cl. ............................. 250/214 A; 250/214 R; 250/214 AG
(58) Field of Classification Search .............. 250/208.1, 250/290–293, 214 AL, 214 A, 214 AG; 348/241, 348/294
See application file for complete search history.

(56) References Cited

U.S. PATENT DOCUMENTS 6,498,332 B2 * 12/2002 Funakoshi ............... 250/208.1
6,670,903 B2 * 12/2003 Fujita et al. .............. 341/155

(Continued)

FOREIGN PATENT DOCUMENTS

JP        63-240065 A     10/1988

(Continued)

*Primary Examiner*—Thanh X Luu
*Assistant Examiner*—Tony Ko
(74) *Attorney, Agent, or Firm*—Drinker Biddle & Reath LLP (57) ABSTRACT

The present invention aims at providing a photodetector which can improve each of the dynamic range, S/N ratio, and speed of light detection. A photodiode $PD_{m,n}$ generates electric charges by an amount corresponding to the incident light intensity, and accumulates thus generated electric charges into a junction capacitance part. An electric charge amount level determining circuit $10_{m,n}$ determines the level of amount of electric charges generated by the photodiode $PD_{m,n}$ and accumulated in the junction capacitance part. In an integrating circuit $20_m$, the capacitance value of an integral capacitance part 21 is set according to the result of electric charge amount level determination, the electric charges inputted from the photodiode $PD_{m,n}$ by way of a switch $SW1_{m,n}$ are accumulated into the integral capacitance part 21, and a voltage $V_{20}$ corresponding to the amount of thus accumulated electric charges is outputted. The voltage $V_{inp}$ fed to a non-inverting input terminal of an amplifier A in the integrating circuit $20_m$ is set greater in a second period during which the integral capacitance part 21 of the integrating circuit $20_m$ accumulates electric charges than in a first period during which the junction capacitance part of the photodiode $PD_{m,n}$ accumulates electric charges.

7 Claims, 10 Drawing Sheets

U.S. PATENT DOCUMENTS

| | | | |
|---|---|---|---|
| 6,908,779 B2 * | 6/2005 | Ogawa et al. | 438/27 |
| 7,075,050 B2 * | 7/2006 | Mizuno | 250/214 R |
| 7,286,172 B2 * | 10/2007 | Mizuno et al. | 348/294 |
| 2002/0134918 A1 * | 9/2002 | Miida | 250/214.1 |
| 2003/0080280 A1 * | 5/2003 | Takimoto et al. | 250/214.1 |

FOREIGN PATENT DOCUMENTS

| | | |
|---|---|---|
| JP | 3-195278 A | 8/1991 |
| JP | 4-172083 A | 6/1992 |
| JP | 8-68691 A | 3/1996 |
| JP | 2000-101060 A | 4/2000 |
| WO | 02/012845 A1 | 2/2002 |

\* cited by examiner

PHOTODECTOR INCLUDING PHOTODIODES HAVING IMPROVED DYNAMIC RANGE, S/N RATIO AND SPEED OF LIGHT DETECTION

TECHNICAL FIELD

The present invention relates to a photodetector including a photodiode.

BACKGROUND ART

A photodetector is an apparatus comprising one or a plurality of photodiodes, an amplifier, and an integrating circuit including an integral capacitance part, and may further comprise signal processing circuits subsequent thereto (see, for example, International Publication No. 02/12845 pamphlet). In this photodetector, a switch is provided between each photodiode and an input terminal of the integrating circuit, such that electric charges generated in response to light incident on the photodiode are accumulated in a junction capacitance part of the photodiode during when the switch is open, whereas, when the switch is closed, the electric charges accumulated in the junction capacitance part so far are fed to the input terminal of the integrating circuit by way of the switch, so as to be accumulated in the integral capacitance part of the integrating circuit. Then, the voltage corresponding to the amount of electric charges accumulated in the integral capacitance part is outputted from the integrating circuit. According to the voltages outputted from the integrating circuit in response to the respective amounts of electric charges generated in a plurality of photodiodes, the light incident on a photosensitive surface in which the plurality of photodiodes are arranged is detected. There is a case where the photodetector further comprises an A/D converter circuit for converting voltages (analog values) outputted from the integrating circuit into digital values. In this case, the incident light intensity is obtained as a digital value, which can further be processed by a computer or the like.

DISCLOSURE OF THE INVENTION

However, the dynamic range, S/N ratio, and speed of light detection in the photodetector such as the one mentioned above depend on the junction capacitance value of the photodiodes, and thus are hard to improve together.

In order to overcome the problem mentioned above, it is an object of the present invention to provide a photodetector which can improve each of the dynamic range, S/N ratio, and speed of light detection.

The photodetector in accordance with the present invention comprises (1) a photodiode having an anode terminal and a cathode terminal (a reverse bias voltage is applied between the anode terminal and the cathode terminal), generating an electric charge by an amount corresponding to an incident light intensity, and accumulating the electric charge into a junction capacitance part; (2) an integrating circuit having an input terminal connected to the photodiode by way of a switch, inputting the electric charge accumulated in the junction capacitance part to the input terminal, accumulating the electric charge into an integral capacitance part, and outputting a voltage corresponding to an amount of the accumulated electric charge; and (3) reverse bias voltage changing means for making the value of reverse bias voltage applied to the photodiode greater in a second period during which the integral capacitance part of the integrating circuit accumulates the electric charge than in a first period during which the junction capacitance part of the photodiode accumulates the electric charge.

During the period when the switch arranged between the photodiode and the input terminal of the integrating circuit is open in the photodetector in accordance with the present invention, electric charges generated in response to the light incident on the photodiode are accumulated into the junction capacitance part of the photodiode. When the switch is closed, the electric charges accumulated in the junction capacitance part of the photodiode so far are fed into the integrating circuit by way of the switch, so as to be accumulated into the integral capacitance part of the integrating circuit, whereby a voltage corresponding to the amount of electric charge accumulated in the integral capacitance part is outputted from the integrating circuit. In particular, the value of reverse bias voltage applied to the photodiode is set higher in the second period during which the integral capacitance part of the integrating circuit accumulates the electric charges than in the first period during which the junction capacitance part of the photodiode accumulates the electric charges. As a consequence, this photodetector can improve each of the dynamic range, S/N ratio, and speed of light detection.

Preferably, in the photodetector in accordance with the present invention, (1) the integrating circuit includes an amplifier having a first input terminal, a second input terminal, and an output terminal, and the integral capacitance part is provided between the input terminal and output terminal, and (2) the reverse bias voltage changing means changes the value of reverse voltage applied to the photodiode by altering a voltage fed to the second input terminal of the amplifier between the first and second periods. In this case, the first and second input terminals of the amplifier form a virtual short circuit therebetween, whereby their potentials are equal with each other. Therefore, the value of reverse bias voltage applied to the photodiode can be changed when the voltage fed to the second input terminal of the amplifier is altered.

Preferably, in the photodetector in accordance with the present invention, the photodiode is of a buried type including a second semiconductor region of a second conduction type arranged on a first semiconductor region of a first conduction type, and a third semiconductor region of the first conduction type arranged on the second semiconductor region, the first and second semiconductor regions forming a pn junction, the second and third semiconductor regions forming a pn junction. Preferably, the photodiode includes a fourth semiconductor region of the second conduction type, in contact with the second semiconductor region, the fourth semiconductor region having a higher impurity content than that of the second semiconductor region, and outputs an electric charge from the fourth semiconductor region by an amount corresponding to the incident light intensity. Using a buried photodiode as such is also effective in improving the S/N ratio of light detection because leak currents are restrained from generating. Since the photodiode can completely be depleted by increasing the reverse bias voltage thereof in the second period during which the integral capacitance part of the integrating circuit accumulates the electric charges, the junction capacitance value in the photodiode can be made substantially zero, which is also effective in improving the S/N ratio and speed of light detection. Here, one of the first and second conduction types refers to n type, whereas the other refers to p type.

Preferably, the photodetector in accordance with the present invention further comprises an electric charge amount level determining circuit for determining a level of the amount of electric charge generated in the photodiode, the integral capacitance part has a variable capacitance value, and the capacitance value is set according to the level determined by the electric charge amount level determining circuit. In this case, the level of electric charges generated by the photodiode and accumulated in the junction capacitance part is determined by the electric charge amount level determining circuit. According to thus determined electric charge amount level, the capacitance value of the integral capacitance part in the integrating circuit is set. Thereafter, the electric charges generated in the photodiode are accumulated into the integral capacitance part in the integrating circuit, whereby a voltage signal having a value corresponding to the amount of accumulated electric charges is outputted. When the incident light intensity is high, the capacitance value of the variable capacitance part in the integrating circuit is set to a relatively large value, whereby even the high incident light intensity can be detected without saturation. When the incident light intensity is low, on the other hand, the capacitance value of the variable capacitance part in the integrating circuit is set to a relatively small value, whereby even the low incident light intensity can be detected with a favorable sensitivity. When the electric charge amount level determining circuits are provided in a one-to-one relationship with respect to the photodiodes in this photodetector, the capacitance value of the integral capacitance part in the integrating circuit can be set rapidly, whereby the incident light intensity can be detected with a high speed.

Preferably, in the photodetector in accordance with the present invention, one integrating circuit is provided for N photodiodes (N being an integer of 2 or greater). Preferably, the photodiode is arranged on a first substrate, whereas the integrating circuit is arranged on a second substrate, the first and second substrates being connected to each other with a bump. In this case, the first and second substrates can be manufactured by their respective optimal manufacturing processes, which is favorable in terms of improving the integration density.

BEST MODES FOR CARRYING OUT THE INVENTION

In the following, embodiments of the present invention will be explained in detail with reference to the accompanying drawings. In the explanation of the drawings, constituents identical to each other will be referred to with numerals identical to each other without repeating their overlapping descriptions.

Figure 1:
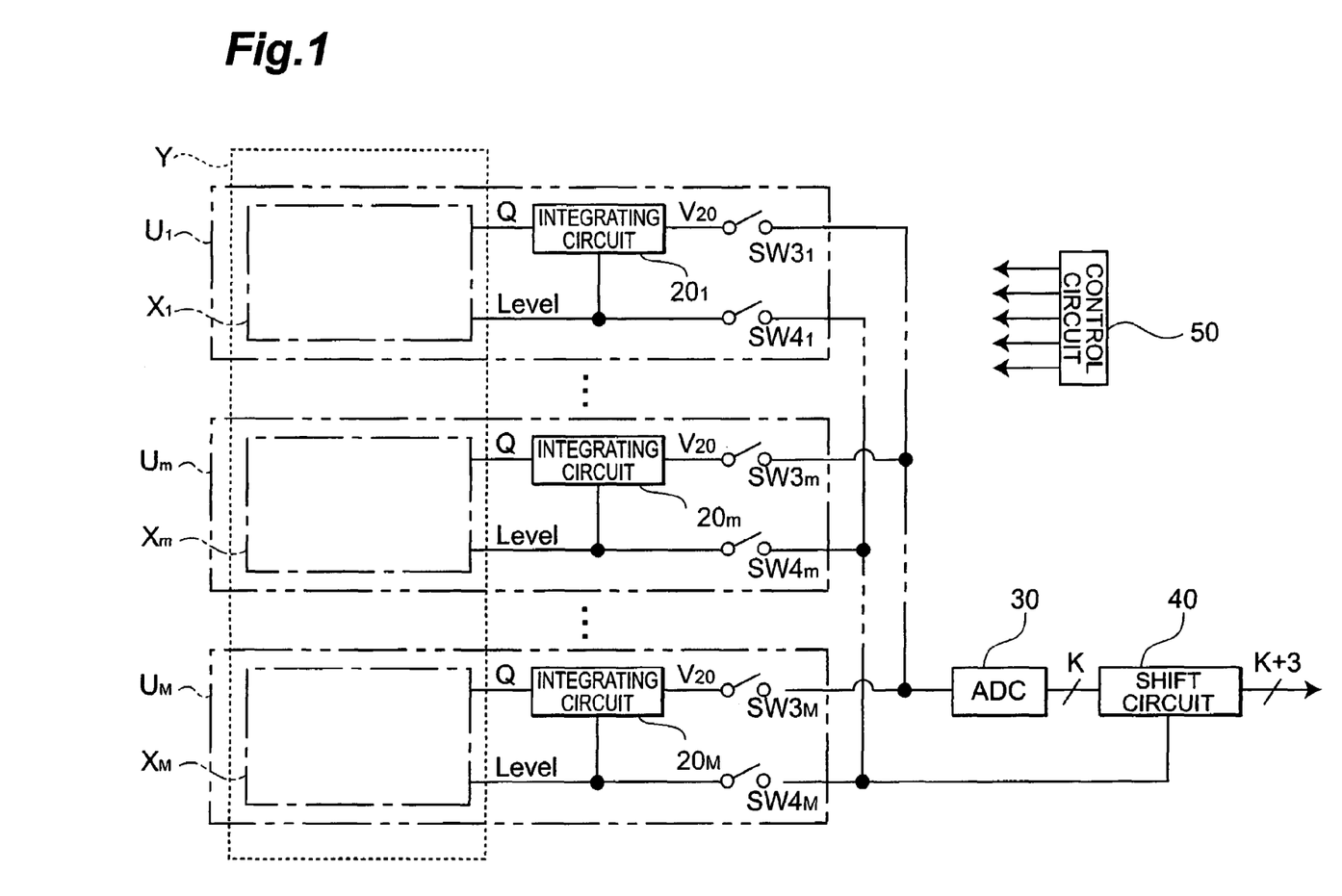
FIG. 1 is an overall diagram of a photodetector 1 in accordance with an embodiment.
Figure 2:
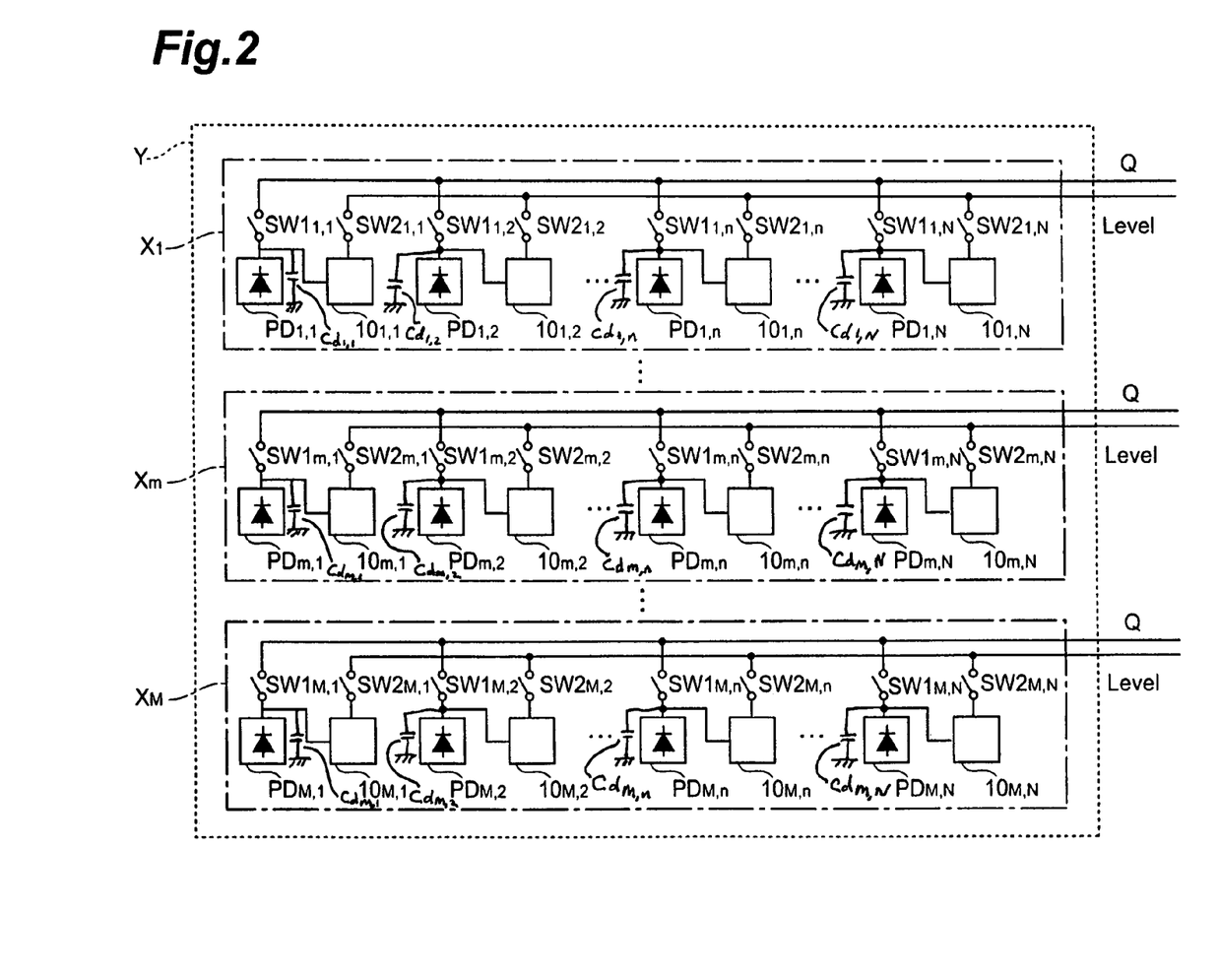
FIG. 2 is a partial diagram of the photodetector 1 in accordance with the embodiment.

FIG. 1 is an overall diagram of a photodetector 1 in accordance with an embodiment. FIG. 2 is a partial diagram of the photodetector 1 in accordance with this embodiment. FIG. 2 shows details of blocks $X_1$ to $X_M$ within the area Y indicated by dotted lines in FIG. 1. The photodetector 1 shown in these drawings comprises M units $U_1$ to $U_M$, an A/D converter 30, a shift circuit 40, and a control circuit 50. Each unit $U_m$ has the same configuration comprising N photodiodes $PD_{m,1}$ to $PD_{m,N}$ having respective junction compacitance parts $Cd_{m,1}$ to $Cd_{m,N}$, N electric charge amount level determining circuits $10_{m,1}$ to $10_{m,N}$, N first switches $SW1_{m,1}$ to $SW1_{m,N}$, N second switches $SW2_{m,1}$ to $SW2_{m,N}$, an integrating circuit $20_m$, a switch $SW3_m$, and a switch $SW4_m$. Here, M is an integer of 1 or greater, N is an integer of 2 or greater, m is an integer of at least 1 but not greater than M, and n in the following is an integer of at least 1 but not greater than N.

Each photodiode $PD_{m,n}$ is a photodiode having an anode terminal and a cathode terminal (a reverse bias voltage is applied between the anode terminal and the cathode terminal), generating electric charges Q by an amount corresponding to the incident light intensity, and accumulating thus generated electric charges Q into a junction capacitance part $Cd_{m,n}$. Each switch $SW1_{m,n}$ is arranged between its corresponding photodiode $PD_{m,n}$ and the input terminal of the integrating circuit $20_m$, and can electrically be opened and closed.

Each electric charge amount level determining circuit $10_{m,n}$ is provided for its corresponding photodiode $PD_{m,n}$, determines the level of the amount of electric charges Q generated in the photodiode $PD_{m,n}$ and accumulated in the junction capacitance part, and outputs a level signal Level indicative of the result of level determination. Switch $SW2_{m,n}$ is arranged between its corresponding electric charge amount level determining circuit $10_{m,n}$ and the integrating circuit $20_m$, and can electrically be opened and closed. The level signal Level is a digital signal of 1 bit or a plurality of bits, whereas the switch $SW2_{m,n}$ includes switches by a number corresponding to that of the bits.

The integrating circuit $20_m$ includes an integral capacitance part having a variable capacitance value, whose input terminal is connected to the photodiodes $PD_{m,n}$ by way of their corresponding switches $SW1_{m,n}$. As the switches $SW1_{m,1}$ to $SW1_{m,N}$ are sequentially opened and closed, the respective electric charges Q are sequentially outputted from the N photodiodes $PD_{m,1}$ to $PD_{m,N}$, so as to be fed into the input terminal and accumulated into the integral capacitance part, whereby a voltage $V_{20}$ corresponding to the amount of thus accumulated electric charges Q is outputted from an output terminal. On the other hand, the integral capacitance part is connected to the electric charge amount level determining circuits $10_{m,n}$ by way of their corresponding switches $SW2_{m,n}$. As the switches $SW2_{m,1}$ to $SW2_{m,N}$ are sequentially opened and closed, the level signals Level are sequentially inputted from the N electric charge amount level determining circuits $10_{m,n}$. According to thus inputted level signals Level, the capacitance value is set.

The A/D converter circuit 30 receives inputs of the voltages $V_{20}$ sequentially outputted from the output terminals of the integrating circuits $20_m$ by way of the switches $SW3_m$, A/D-converts the voltage $V_{20}$ into digital values, and outputs the digital values corresponding to the voltages $V_{20}$. The shift circuit 40 receives inputs of the digital values outputted from the A/D converter circuit 30, sequentially receives inputs of the respective level signals Level outputted from the electric charge amount level determining circuits $10_{m,1}$ to $10_{m,N}$ by way of the switches $SW2_{m,n}$ and switches $SW4_m$, shifts the bits of the digital values according to the level signals Level, and outputs thus bit-shifted digital values.

The control circuit 50 regulates operations of the photodetector 1 as a whole. In particular, the control circuit 50 regulates the opening and closing of each of the switches $SW1_{m,n}$ and $SW2_{m,n}$. Specifically, for each photodiode $PD_{m,n}$, the control circuit 50 closes the corresponding switch $SW2_{m,n}$ and, after the capacitance value of the integral capacitance part in the integrating circuit $20_m$ is set according to the level signal Level outputted from the corresponding electric charge amount level determining circuit $10_{m,n}$, closes the corresponding switch $SW1_{m,n}$, thereby starting an integrating operation in the integrating circuit $20_m$. The control circuit 50 also regulates timings of respective operations of the integrating circuits $20_m$, switches $SW3_m$, switches $SW4_m$, A/D converter circuit 30, and shift circuit 40. These operation timings will later be explained in detail. FIG. 1 omits control signals sent from the control circuit 50 to the other constituent circuits.

Figure 3:
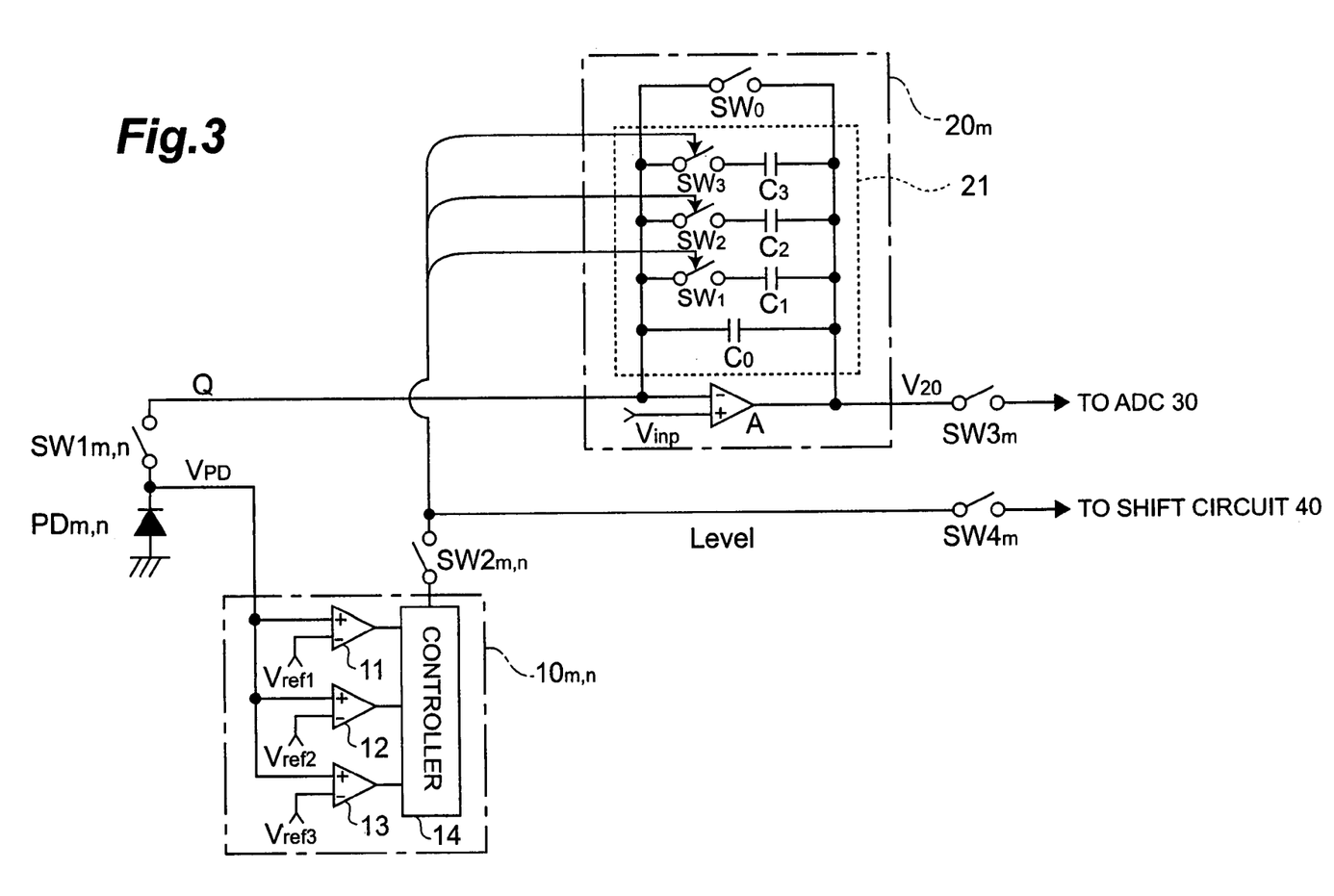
FIG. 3 is a circuit diagram of an electric charge amount level determining circuit $10_{m,n}$ and an integrating circuit $20_m$ which are included in the photodetector 1 in accordance with the embodiment.

FIG. 3 is a circuit diagram of the electric charge amount level determining circuit $10_{m,n}$ and integrating circuit $20_m$ included in the photodetector 1 in accordance with this embodiment. This diagram shows only the part corresponding to the n-th photodiode $PD_{m,n}$ within the m-th unit $U_m$.

The electric charge amount level determining circuit $10_{m,n}$ includes three comparators 11 to 13 and a controller 14. The non-inverting input terminal of each of the comparators 11 to 13 is connected to the junction between the cathode terminal of the photodiode $PD_{m,n}$ and the switch $SW1_{m,n}$. Reference voltages $V_{ref1}$, $V_{ref2}$, and $V_{ref3}$ are fed to the inverting input terminals of the comparators 11, 12, and 13, respectively. Each of the comparators 11 to 13 compares the respective voltages fed to its inverting and non-inverting input terminals in terms of magnitude, and outputs a signal indicative of the result of comparison to the controller 14. The controller 14 receives inputs of the respective signals outputted from the comparators 11 to 13, and outputs a 3-bit level signal Level for setting the capacitance value of the integral capacitance part in the integrating circuit $20_m$.

Here, the reference voltages $V_{ref1}$ to $V_{ref3}$ satisfy the following relational expressions:

$$V_{ref1} = V_{sat}/2 \quad (1a)$$

$$V_{ref2} = V_{sat}/4 \quad (1b)$$

$$V_{ref3} = V_{sat}/8 \quad (1c)$$

Here, $V_{sat}$ is a constant value. Therefore, the three comparators 11 to 13 can determine within which of the following ranges:

$$V_{PD} < V_{sat}/8 \quad (2a)$$

$$V_{sat}/8 \leq V_{PD} < V_{sat}/4 \quad (2b)$$

$$V_{sat}/4 \leq V_{PD} < V_{sat}/2 \quad (2c)$$

$$V_{sat}/2 \leq V_{PD} \quad (2d)$$

the potential $V_{PD}$ of the cathode terminal of the photodiode $PD_{m,n}$ falls. The level signal Level outputted from the controller 14 indicates within which ranges of the above-mentioned expressions (2a) to (2d) the potential $V_{PD}$ falls.

The integrating circuit $20_m$ includes an amplifier A, capacitance elements $C_0$ to $C_3$, and switches $SW_0$ to $SW_3$. The amplifier A includes a non-inverting input terminal, an inverting input terminal, and an output terminal. The non-inverting input terminal and the inverting input terminal of the amplifier A form a virtual short circuit therebetween, thus yielding potentials identical to each other. The non-inverting input terminal receives inputs of a voltage $V_{inp}$. The voltage $V_{inp}$ is not constant but variable. For example, one of a constant voltage $V_H$ from a first constant voltage source and a constant voltage $V_L$ from a second constant voltage source ($V_L < V_H$) is selectively fed to the non-inverting input terminal of the amplifier A. The inverting input terminal of the amplifier A is connected to the cathode terminal of the photodiode $PD_{m,n}$ by way of the switch $SW1_{m,n}$. The output terminal of the amplifier A is connected to the A/D converter circuit 30 by way of the switch $SW3_m$. The switch $SW_1$ and capacitance element $C_1$ connected in series, the switch $SW_2$ and capacitance element $C_2$ connected in series, the switch $SW_3$ and capacitance element $C_3$ connected in series, the capacitance element $C_0$, and the switch $SW_0$ are connected in parallel between the inverting input terminal and the output terminal of the amplifier A.

The capacitance elements $C_0$ to $C_3$ and switches $SW_1$ to $SW_3$ constitute an integral capacitance part 21 having a variable capacitance value. Namely, the switches $SW_1$ to $SW_3$ open and close depending on the level signal Level inputted from the controller 14 of the electric charge amount level determining circuit $10_{m,n}$ by way of the switch $SW2_{m,n}$ whereby the capacitance value of the integral capacitance part 21 is determined according to their states of opening/closing. Here, the respective capacitance values of the capacitance elements $C_0$ to $C_3$ satisfy the relational expressions of:

$$C_0 = C \quad (3a)$$

$$C_1 = C \quad (3b)$$

$$C_2 = 2C \quad (3c)$$

$$C_3 = 4C \quad (3d)$$

Here, C is a constant value.

The capacitance value of the integral capacitance part 21 is set when the respective opening/closing states of the switches $SW_1$ to $SW_3$ are set in response to the level signal Level, i.e., according to the potential $V_{PD}$ of the cathode terminal of the photodiode $PD_{m,n}$ determined by the three comparators 11 to 13, as follows. Namely, when it is determined that the potential $V_{PD}$ falls within the range of the above-mentioned expression (2a), all the switches $SW_1$ to $SW_3$ are opened, whereby the capacitance value of the integral capacitance part 21 is set to C ($=C_0$). When it is determined that the potential $V_{PD}$ falls within the range of the above-mentioned expression (2b), only the switch $SW_1$ is closed, whereby the capacitance value of the integral capacitance part 21 is set to 2C ($=C_0+C_1$). When it is determined that the potential $V_{PD}$ falls within the range of the above-mentioned expression (2c), the switches $SW_1$ and $SW_2$ are closed, whereby the capacitance value of the integral capacitance part 21 is set to 4C ($=C_0+C_1+C_2$).

When it is determined that the potential $V_{PD}$ falls within the range of the above-mentioned expression (2d), all the switches $SW_1$ to $SW_3$ are closed, whereby the capacitance value of the integral capacitance part 21 is set to 8C (=$C_0$+$C_1$+$C_2$+$C_3$). In any of these cases, the voltage $V_{20}$ outputted from the output terminal of the integrating circuit 20$_m$ falls within the range of:

$$V_{sat}/2 \leq V_{20} < V_{sat} \quad (4)$$

The A/D converter circuit 30 receives inputs of the voltages $V_{20}$ sequentially arriving from the respective output terminals 20$_m$ of the units $U_m$ by way of the switches $SW3_m$, A/D-converts the voltages $V_{20}$, and outputs digital values corresponding to the voltages $V_{20}$. Here, the voltages $V_{20}$ fed into the A/D converter circuit 30 always fall within the above-mentioned expression (4), whereby the A/D converter circuit 30 can effectively utilize all the bits of its outputting digital values when A/D converting the voltages $V_{20}$.

The shift circuit 40 receives inputs of the digital values outputted from the A/D converter circuit 30, sequentially receives inputs of the respective level signals Level outputted from the electric charge amount level determining circuits 10$_{m,1}$ to 10$_{m,N}$, shifts the bits of digital values according to the level signals Level, and outputs the bit-shifted digital values. Namely, when a digital value outputted from the A/D converter circuit 30 is a digital value ($D_{K-1}$, $D_{K-2}$, ..., $D_1$, $D_0$) having K bits (where K is an integer of 2 or greater), the shift circuit 40 outputs a digital value having (K+3) bits. When the level signal Level indicates that the potential $V_{PD}$ falls within the range of the above-mentioned expression (2a), the shift circuit 40 outputs the digital value (0, 0, 0, $D_{K-1}$, $D_{K-2}$, ..., $D_1$, $D_0$) having (K+3) bits without shifting the bits of the inputted digital value. When the level signal Level indicates that the potential $V_{PD}$ falls within the range of the above-mentioned expression (2b), the shift circuit 40 shifts the inputted digital value by 1 bit to the higher order, and outputs thus obtained digital value (0, 0, $D_{K-1}$, $D_{K-2}$, ..., $D_1$, $D_0$, 0) having (K+3) bits. When the level signal Level indicates that the potential $V_{PD}$ falls within the range of the above-mentioned expression (2c), the shift circuit 40 shifts the inputted digital value by 2 bits to the higher order, and outputs thus obtained digital value (0, $D_{K-1}$, $D_{K-2}$, ..., $D_1$, $D_0$, 0, 0) having (K+3) bits. When the level signal Level indicates that the potential $V_{PD}$ falls within the range of the above-mentioned expression (2d), the shift circuit 40 shifts the inputted digital value by 3 bits to the higher order, and outputs thus obtained digital value ($D_{K-1}$, $D_{K-2}$, $D_1$, $D_0$, 0, 0, 0) having (K+3) bits.

Figure 4:
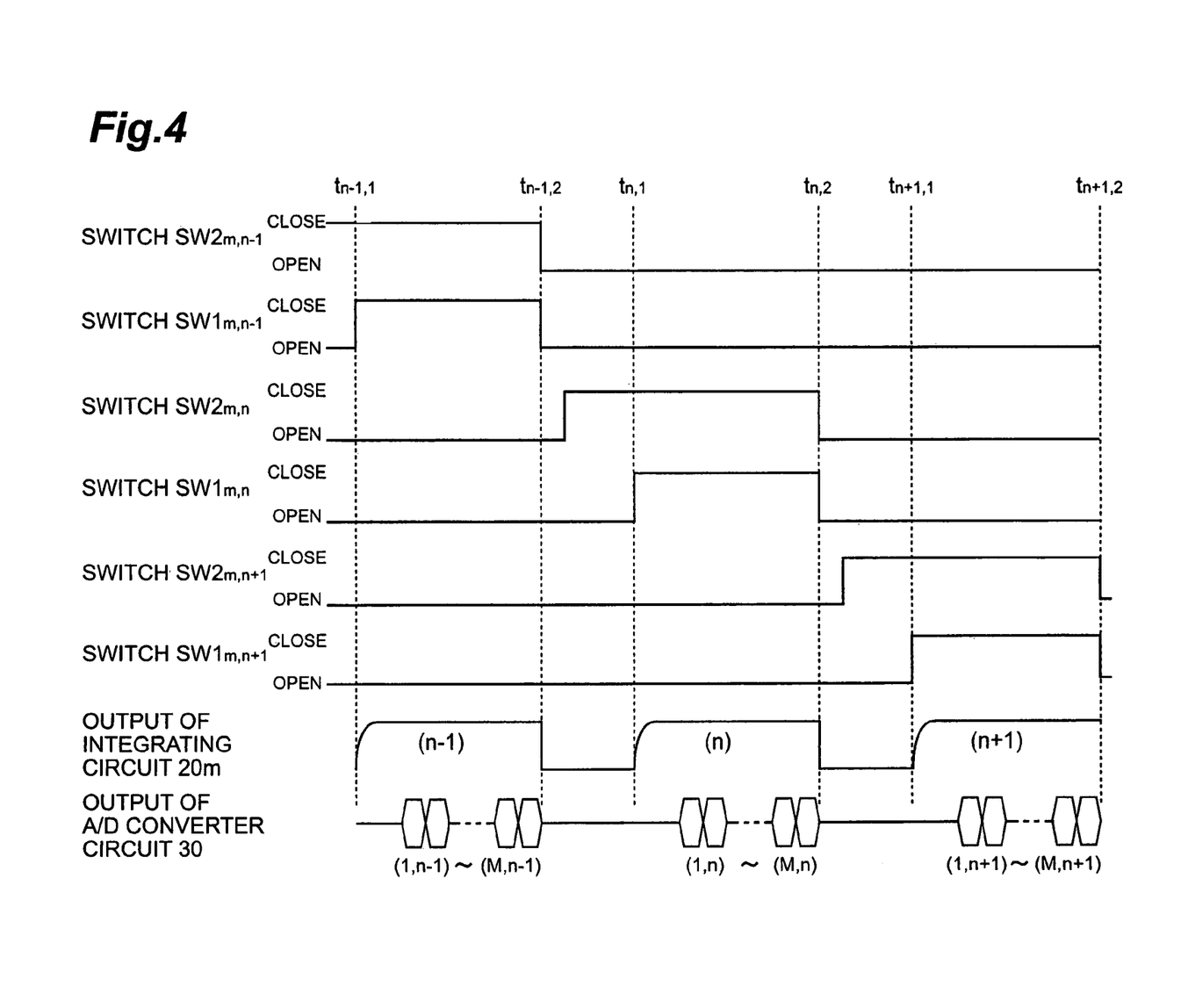
FIG. 4 is a timing chart for explaining operations of the photodetector 1 in accordance with the embodiment.

Operation timings of the photodetector 1 in accordance with this embodiment will now be explained. FIG. 4 is a timing chart for explaining operations of the photodetector 1 in accordance with this embodiment. This chart shows, successively from the upper side, respective opening/closing timings of the switches $SW2_{m,n-1}$ and $SW1_{m,n-1}$ corresponding to the photodiode $PD_{m,n-1}$, respective opening/closing timings of the switches $SW2_{m,n}$ and $SW1_{m,n}$ corresponding to the photodiode $PD_{m,n}$ arranged adjacent to the $PD_{m,n-1}$ in each unit $U_m$, respective opening/closing timings of the switches $SW2_{m,n+1}$ and $SW1_{m,n+1}$ corresponding to the photodiode $PD_{m,n+1}$ arranged adjacent to the $PD_{m,n}$ in each unit $U_m$, the output voltage $V_{20}$ from the integrating circuit 20$_m$, and output digital values from the A/D converter circuit 30.

From time $t_{n-1,2}$ to time $t_{n-1}$, only the (n−1)-th switch $SW2_{m,n-1}$ in the N switches $SW2_{n-1}$ to $SW2_{m,N}$ is closed in each unit $U_m$, whereby the level signal Level outputted from the controller 14 of the (n−1)-th electric charge amount level determining circuit 10$_{m,n-1}$ is fed into the integrating circuit 20$_m$, so that the capacitance value of the integral capacitance part 21 in the integrating circuit 20$_m$ is set according to this level signal. The level signal at this time indicates the level of the potential $V_{PD}$ of the cathode terminal of the photodiode $PD_{m,n}$ determined by the three comparators 11 to 13 of the electric charge amount level determining circuit 10$_{m,n-1}$ and held by the controller 14 at the time $t_{n-1,2}$. The switch $SW_0$ of the integrating circuit 20$_m$ is closed at the time $t_{n-1,2}$, so that the voltage $V_{20}$ outputted from the integrating circuit 20$_m$ is initialized.

During the period from time $t_{n,1}$ to time $t_{n,2}$, only the n-th switch $SW1_{m,n}$ in the N switches $SW1_{m,1}$ to $SW1_{m,n}$ is closed in each unit $U_m$, while the switch $SW_0$ of the integrating circuit 20$_m$ is open, whereby an integrating operation of the integrating circuit 20$_m$ is carried out. The voltage $V_{20}$ outputted from the integrating circuit 20$_m$ at this time corresponds to the amount of electric charge accumulated into the integral capacitance part 21 after being outputted from the n-th switch $SW1_{m,n}$ in the N switches $SW1_{m,1}$ to $SW1_{m,N}$ and the capacitance value of the integral capacitance part 21.

During the period from time $t_{n,1}$ to time $t_{n,2}$, the M switches $SW3_m$ are closed sequentially, and the M switches $SW4_m$ are closed sequentially. The voltages $V_{20}$ sequentially outputted from the M units $U_1$ to $U_M$ are converted into digital values by the A/D converter circuit 30, whereas these digital values are outputted from the shift circuit 40 after being bit-shifted thereby according to the level signals Level sequentially outputted from the M units $U_1$ to $U_M$. The digital values sequentially outputted from the shift circuit 40 at this time correspond to respective intensities of light incident on the n-th photodiodes $PD_{m,n}$ included in the M units $U_1$ to $U_M$.

At the time $t_{n,2}$, the n-th switches $SW1_{m,n}$ and $SW2_{m,n}$ are opened in each unit $U_m$, whereas the switch $SW_0$ in the integrating circuit 20$_m$ is closed, whereby a series of operations concerning the n-th photodiode $PD_{m,n}$ end. During the period from time $t_{n,2}$ to time $t_{n+1,2}$, a series of operations concerning the (n+1)-th photodiode $PD_{m,n+1}$ are similarly carried out in each unit $U_m$. The same holds in subsequent periods.

Figure 5:
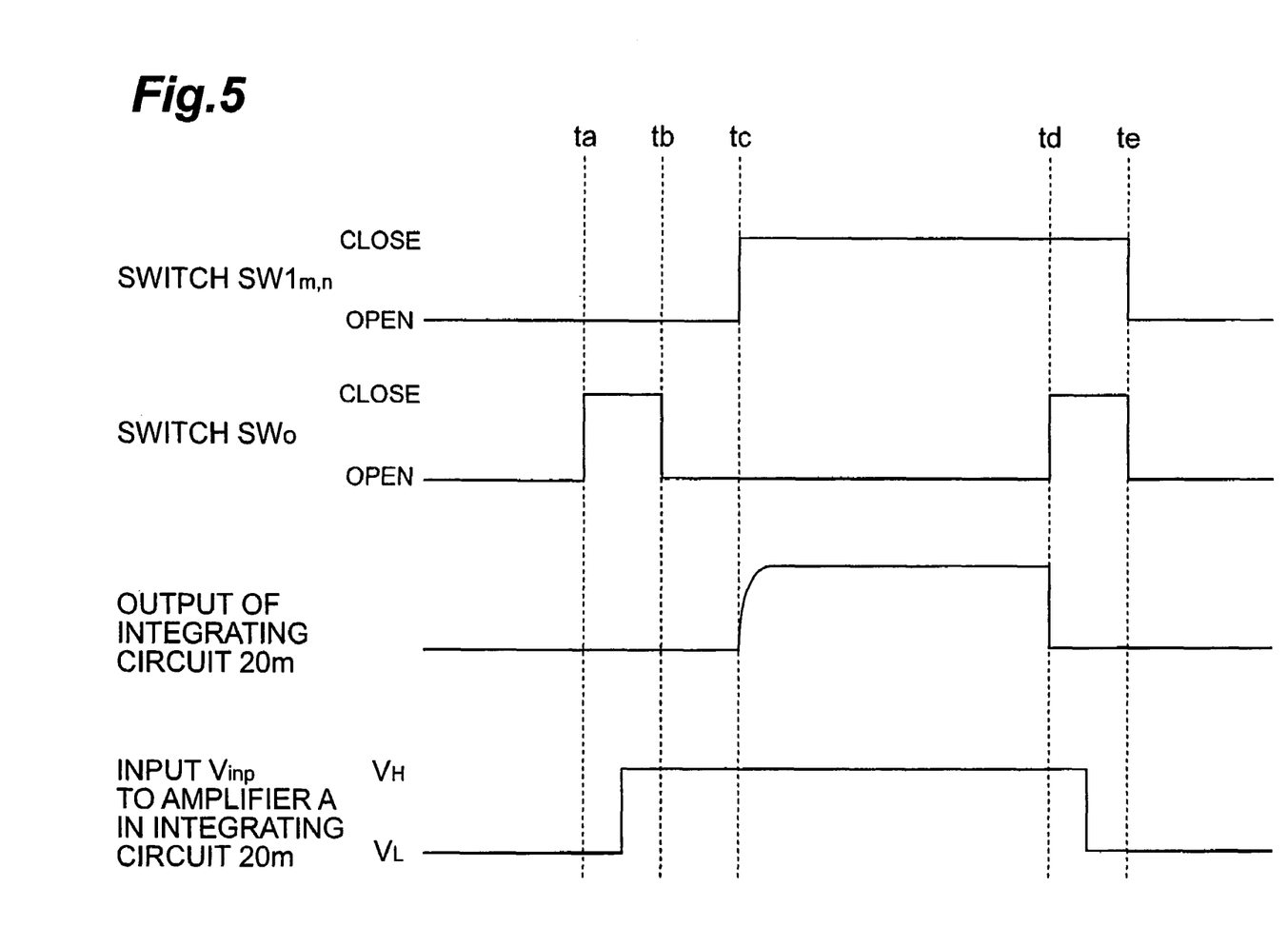
FIG. 5 is a timing chart for explaining operations of the photodetector 1 in accordance with the embodiment in more detail.

FIG. 5 is a timing chart for explaining operations of the photodetector 1 in accordance with this embodiment in more detail. This chart shows, successively from the upper side, the opening/closing timing of the switch $SW1_{m,n}$, the opening/closing timing of the switch $SW_0$ in the integrating circuit 20$_m$, the output voltage $V_{20}$ from the integrating circuit 20$_m$, and the voltage $V_{inp}$ fed to the non-inverting input terminal of the amplifier A in the integrating circuit 20$_m$.

Before time $t_a$, the switch $SW1_{m,n}$ is open, and the switch $SW_0$ in the integrating circuit 20$_m$ is also open. The voltage $V_{inp}$ fed to the non-inverting input terminal of the amplifier A in the integrating circuit 20$_m$ is the lower voltage $V_L$.

At the time $t_a$, the switch $SW_0$ of the integrating circuit 20$_m$ is closed, whereby the output voltage $V_{20}$ from the integrating circuit 20$_m$ is initialized. During the period from time $t_a$ to time $t_b$, the voltage $V_{inp}$ fed to the non-inverting input terminal of the amplifier A in the integrating circuit 20$_m$ changes from the lower voltage $V_L$ to the higher voltage $V_H$.

At the time $t_b$, the switch $SW_0$ of the integrating circuit 20$_m$ is opened, so that the integrating circuit 20$_m$ is placed in a condition enabling an operation of accumulating electric charges. When the switch $SW1_{m,n}$ is closed at time $t_c$, the electric charges accumulated in the junction capacitance part of the photodiode $PD_{m,n}$ so far are fed into the integrating circuit 20$_m$ by way of the switch $SW1_{m,n}$, so as to be accumulated into the integral capacitance part 21 of the integrating circuit 20$_m$, whereby the integrating circuit 20$_m$ outputs the voltage $V_{20}$ corresponding to the amount of electric charges accumulated in the integral capacitance part 21.

At time $t_d$, the switch $SW_0$ of the integrating circuit $20_m$ is closed, so that the electric charge accumulating operation in the integrating circuit $20_m$ is terminated, whereby the output voltage $V_{20}$ from the integrating circuit $20_m$ is initialized. During the period from time $t_d$ to time $t_e$, the voltage $V_{inp}$ fed to the non-inverting input terminal of the amplifier A in the integrating circuit $20_m$ changes from the higher voltage $V_H$ to the lower voltage $V_L$. At the time $t_e$, the switch $SW1_{m,n}$ is opened, and the switch $SW_0$ of the integrating circuit $20_m$ is also opened. In this embodiment, the voltage $V_{inp}$ fed to the non-inverting input terminal of the amplifier A in the integrating circuit $20_m$ is switched from the lower voltage $V_L$ to the higher voltage $V_H$ or vice versa in the period during which the switch $SW_0$ of the integrating circuit $20_m$ is closed (the period during which the output voltage from the integrating circuit $20_m$ is initialized), whereby the output voltage of the integrating circuit $20_m$ is not affected thereby.

Figure 6:
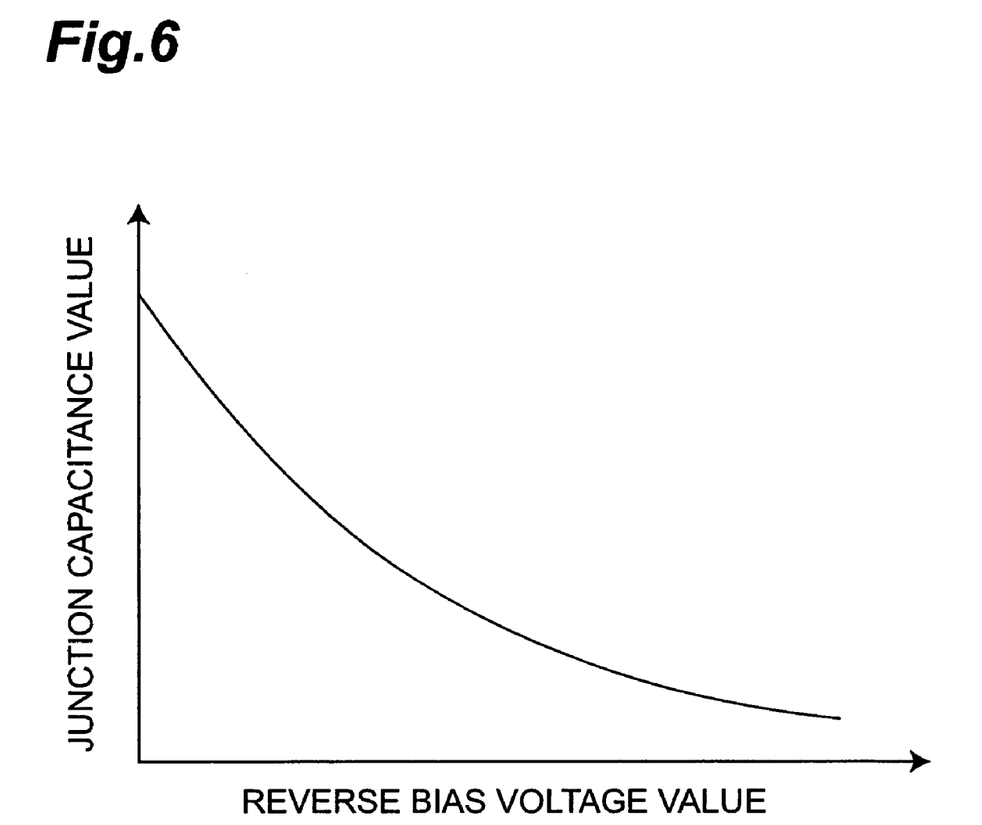
FIG. 6 is a graph showing the relationship between the reverse bias voltage and junction capacitance value in a photodiode.

In the photodetector 1, as in the foregoing, the lower voltage $V_L$ is fed as the voltage $V_{inp}$ to the non-inverting input terminal of the amplifier A in the integrating circuit $20_m$ in the first period (before the time $t_a$ and after the time $t_e$) during which the junction capacitance part of the photodiode $PD_{m,n}$ accumulates electric charges, whereas the higher voltage $V_H$ is fed as the voltage $V_{inp}$ to the non-inverting input terminal of the amplifier A in the integrating circuit $20_m$ in the second period (times $t_c$ to $t_d$) during which the integral capacitance part 21 of the integrating circuit $20_m$ accumulates electric charges. Also, as shown in FIG. 6, the junction capacitance value is smaller as the reverse bias voltage of a photodiode is greater. Therefore, as compared with the first period, a greater reverse bias voltage is applied to the photodiode $PD_{m,n}$ whereas the junction capacitance value of $PD_{m,n}$ becomes smaller in the second period. Namely, means for changing the voltage $V_{inp}$ fed to the non-inverting input terminal of the amplifier A in the integrating circuit $20_m$ acts as reverse bias voltage changing means.

As such, the junction capacitance value of the photodiode $PD_{m,n}$ is greater in the first period during which the junction capacitance part of the photodiode $PD_{m,n}$ accumulates electric charges, whereby the junction capacitance part of the photodiode $PD_{m,n}$ can accumulate a greater number of electric charges. In the second period during which the integral capacitance part 21 of the integrating circuit $20_m$ accumulates electric charges, on the other hand, the junction capacitance value of the photodiode $PD_{m,n}$ is smaller, so that the migration of electric charges from the junction capacitance part of the photodiode $PD_{m,n}$ to the integral capacitance part 21 of the integrating circuit $20_m$ can be carried out at a high speed with a low noise. Namely, the photodetector 1 in accordance with, this embodiment can improve each of the dynamic range, S/N ratio, and speed of light detection.

Since each photodiode $PD_{m,n}$ is provided with the electric charge amount level determining circuit $10_{m,n}$ in the photodetector 1 in accordance with this embodiment, an appropriate capacitance value corresponding to the amount of electric charges outputted from the photodiode $PD_{m,n}$ is set in the integral capacitance part 21 of the integrating circuit $20_m$, whereby the dynamic range of incident light intensity detection for each photodiode (i.e., per pixel in one picture) can be enlarged. Since the electric charge amount level determining circuits $10_{m,n}$ are provided in a one-to-one relationship with respect to the photodiodes $PD_{m,n}$, the capacitance value of the integral capacitance part 21 in the integrating circuit $20_m$ can be set rapidly, whereby the incident light intensity can be detected with a high speed. Also, since each electric charge amount level determining circuit $10_{m,n}$ does not require high-speed processing when determining the electric charge amount level, the power consumption can be saved.

Figure 7:
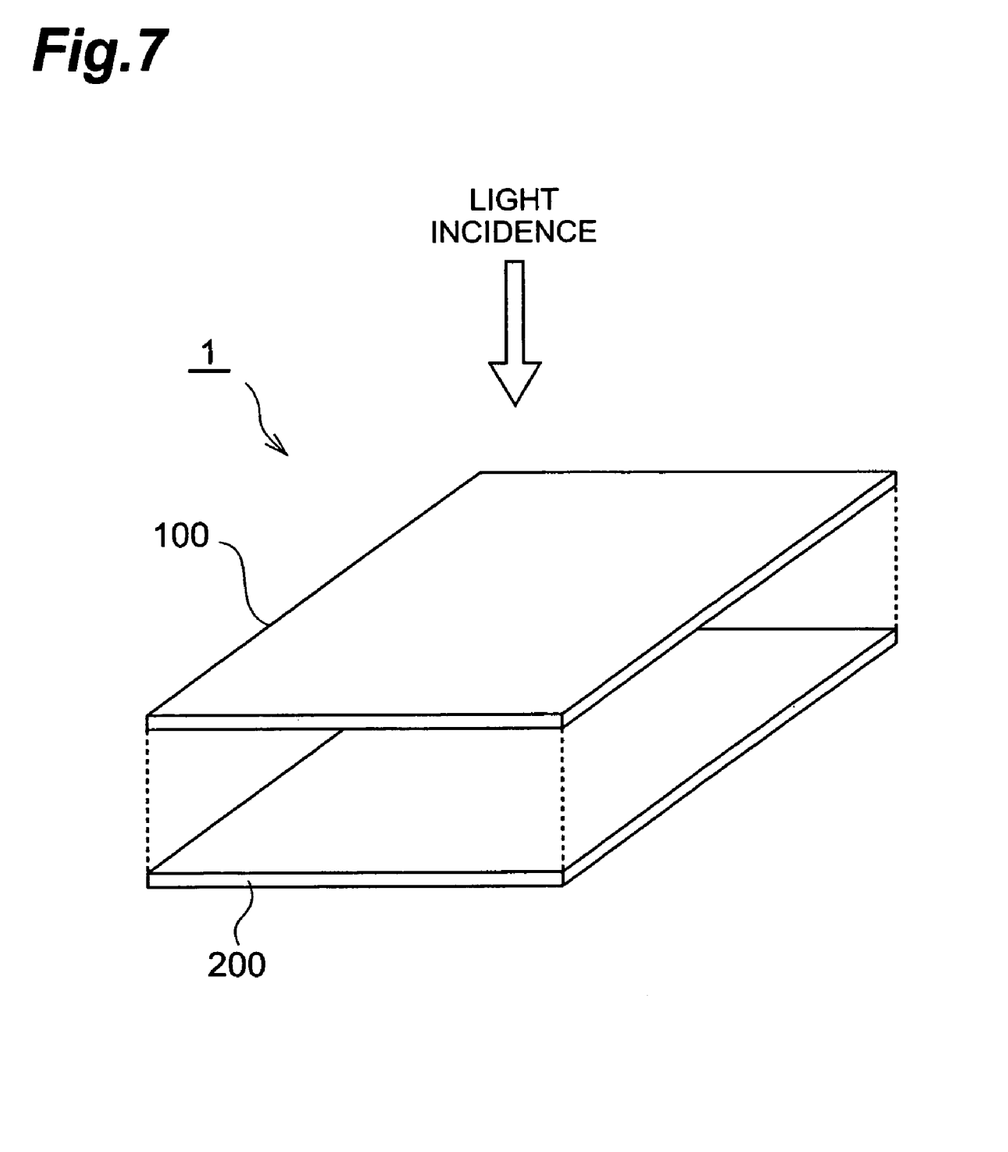
FIG. 7 is a perspective view showing the relationship of arrangement of a first substrate 100 and a second substrate 200 in the photodetector 1 in accordance with the embodiment.

A mode of mounting the photodetector 1 in accordance with this embodiment will now be explained with reference to FIGS. 7 to 10B. FIG. 7 is a perspective view showing the relationship of arrangement of a first substrate 100 and a second substrate 200 in the photodetector 1 in accordance with this embodiment. As shown in FIG. 7, the photodetector 1 is split onto two substrates, i.e., the first substrate 100 and the second substrate 200. On the first substrate 100, M×N photodiodes $PD_{1,1}$ to $PD_{M,N}$ are arranged in a matrix of M rows by N columns. On the second substrate 200, M×N electric charge amount level determining circuits $10_{1,1}$ to $10_{M,N}$, M×N switches $SW1_{1,1}$ to $SW1_{M,N}$, M×N switches $SW2_{1,1}$ to $SW2_{M,N}$, M integrating circuits $20_1$ to $20_m$, M switches $SW3_1$ to $SW3_M$, M switches $SW4_1$ to $SW4_M$, an A/D converter circuit 30, a shift circuit 40, and a control circuit 50 are arranged. As shown in FIG. 7, the substrates are mounted while being laminated such that they are overlaid on each other in the light incidence direction. The respective cathode electrodes of the photodiodes $PD_{m,n}$ on the first substrate 100 are electrically connected to their corresponding switches $SW1_{m,n}$ and electric charge amount level determining circuits $10_{m,n}$ on the second substrate 200 by way of bumps.

Figure 8:
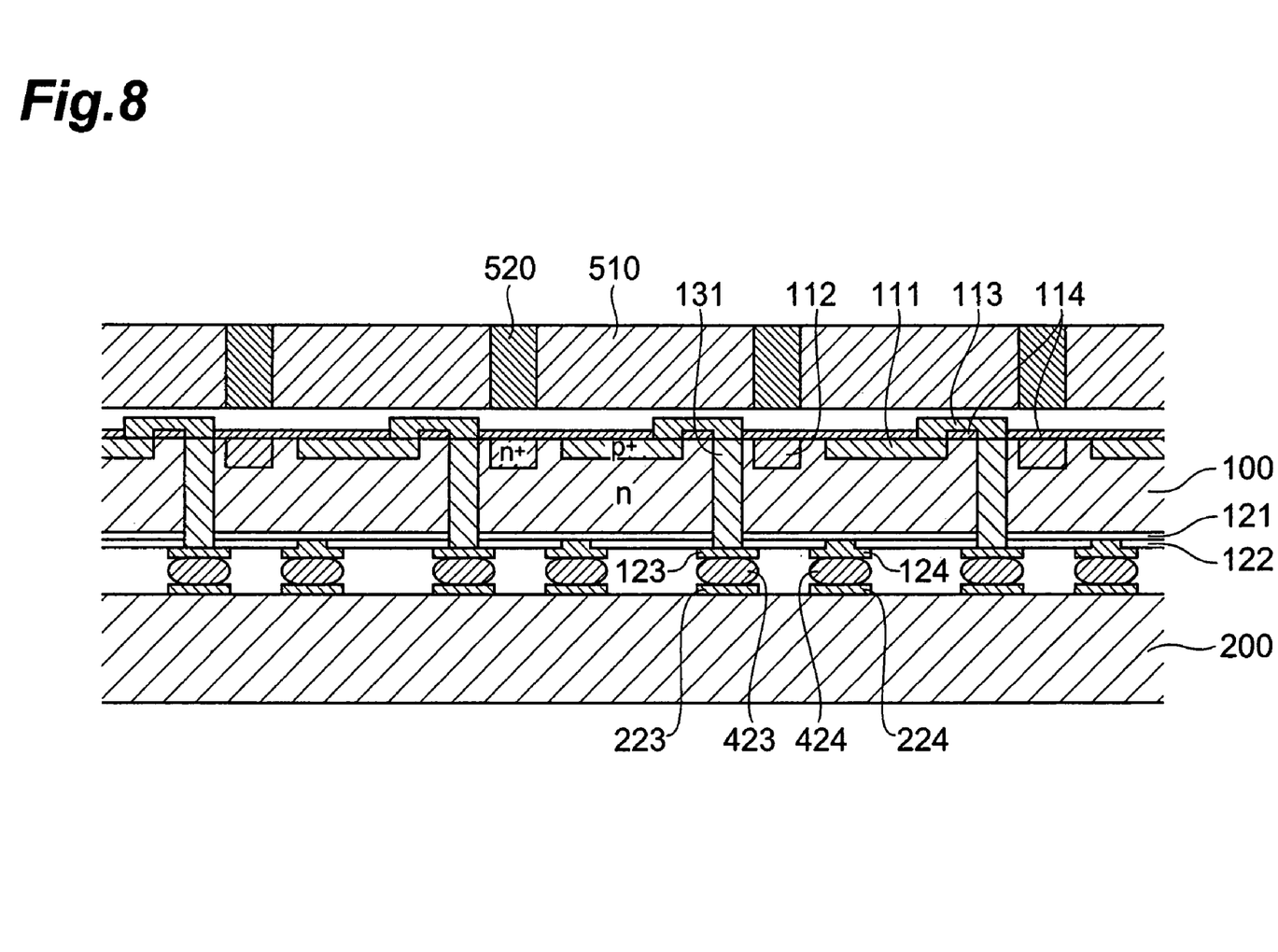
FIG. 8 is a view showing an example of cross sections of the first substrate 100 and second substrate 200 in the photodetector 1 in accordance with the embodiment.

FIG. 8 is a view showing an example of cross sections of the first substrate 100 and second substrate 200 in the photodetector 1 in accordance with this embodiment. Since a basic pattern is repeated in the lateral direction in this drawing, only one basic pattern will be explained in the following.

Formed on a first surface (the upper face in the drawing) of an n-type semiconductor substrate in the first substrate 100 are a $p^+$ region 111 constructing a photodiode PD by forming a pn junction with the n-type substrate, and an $n^+$ region 112 as an isolation region. Formed on a second surface (the lower face in the drawing) of the n-type semiconductor substrate in the first substrate 100 are an $n^+$-type impurity layer 121 forming an ohmic connection with a bonding pad 124, an insulating protective layer 122 for protecting the surface, and the bonding pad 124 penetrating through the protective layer 122 so as to be electrically connected to the $n^+$-type impurity layer 121. A through hole is formed so as to penetrate through the first substrate 100 between the first and second surfaces, whereas a through electrode 131 is arranged within the through hole by way of an insulator layer formed on the inner wall. A metal lead 113 for electrically connecting the $p^+$ region 111 to the through electrode 131 is formed on an insulating film 114 on the first surface side of the first substrate 100, whereas a bonding pad 123 electrically connected to the through electrode 131 is formed on the second surface side.

Formed on a first surface (the upper face in the drawing) of a semiconductor substrate in the second substrate 200 are a bonding pad 223 electrically connected to a first terminal of a switch SW1, and a bonding pad 224 electrically connected to a ground potential. The bonding pad 123 of the first substrate 100 and the bonding pad 223 of the second substrate 200 are connected to each other with a bump 423, whereas the bonding pad 124 of the first substrate 100 and the bonding pad 224 of the second substrate 200 are connected to each other with a bump 424. The gap between the first substrate 100 and second substrate 200 is filled with a resin.

A scintillator 510 and a shield plate 520 are arranged on the first surface side of the first substrate 100. The scintillator 510 is arranged above the $p^+$ region 111 of the first substrate 100, and generates scintillation light when energy lines such as X-rays are incident thereon. The shield plate 520, which is arranged above the $n^+$ region 112 of the first substrate 100, inhibits energy lines such as X-rays from penetrating therethrough and secures the scintillator 510.

When energy lines such as X-rays are incident on the scintillator 510 in the configuration shown in FIG. 8, the scintillator 510 generates scintillation light. When the scintillation light is incident on the p$^+$ region 111 of the first substrate 100, electric charges are generated in its pn junction electric charges generate. These electric charges pass the metal lead 113, the through electrode 131, the bonding pad 123, the bump 423, and the bonding pad 223 of the second substrate 200, so as to be fed to the input terminal of the integrating circuit 20 by way of the switch SW1 formed on the second substrate 200.

Figure 9:
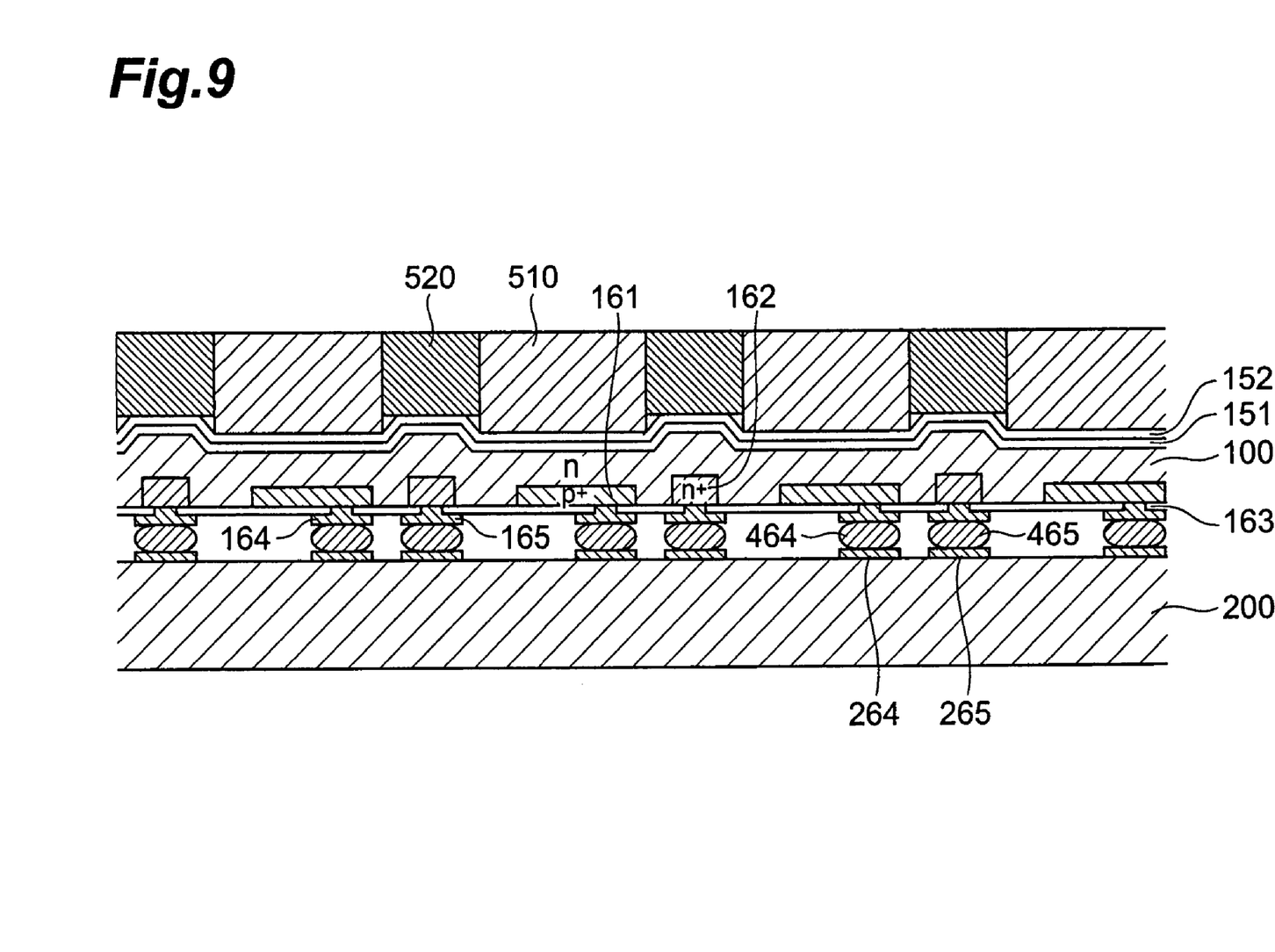
FIG. 9 is a view showing another example of cross sections of the first substrate 100 and second substrate 200 in the photodetector I in accordance with the embodiment.

FIG. 9 is a view showing another example of cross sections of the first substrate 100 and second substrate 200 in the photodetector 1 in accordance with this embodiment. Since a basic pattern is also repeated in the lateral direction in this drawing, only one basic pattern will be explained in the following.

Formed on a first surface (the upper face in the drawing) of an n-type semiconductor substrate in the first substrate 100 are an n$^+$-type accumulation layer 151 for preventing electric charges from recombining, and an insulating protective layer 152 for protecting the surface. Formed on a second surface (the lower face in the drawing) of the n-type semiconductor substrate in the first substrate 100 are a p$^+$ region 161 forming a pn junction with the n-type substrate so as to construct a photodiode PD, and an n$^+$ region 162 as an isolation region, whereas a protective layer 163 is formed on them. Also formed on the second surface of the first substrate 100 are a bonding pad 164 electrically connected to the p$^+$ region 161, and a bonding pad 165 electrically connected to the n$^+$ region 162.

Formed on a first surface (the upper face in the drawing) of a semiconductor in the second substrate 200 are bonding pads 264 electrically connected to a first terminal of the switch SW1, and a bonding pad 265 electrically connected to a ground potential. The bonding pad 164 of the first substrate 100 and the bonding pad 264 of the second substrate 200 are connected to each other with a bump 464. The bonding pad 165 of the first substrate 100 and the bonding pad 265 of the second substrate 200 are connected to each other with a bump 465. The gap between the first substrate 100 and second substrate 200 is filled with a resin.

A scintillator 510 and a shield plate 520 are arranged on the first surface side of the first substrate 100. The scintillator 510 is arranged above the p$^+$ region 161 of the first substrate 100, and generates scintillation light when energy lines such as X-rays are incident thereon. The shield plate 520, which is arranged above the n$^+$ region 162 of the first substrate 100, inhibits energy lines such as X-rays from penetrating therethrough and secures the scintillator 510. The first substrate 100 is etched on the first surface side in the part formed with the p$^+$ region 161, so as to be thinned.

When energy lines such as X-rays are incident on the scintillator 510 in the configuration shown in FIG. 9, the scintillator 510' generates scintillation light. When the scintillation light is incident on the p$^+$ region 161 through the first substrate 100, electric charges are generated in the pn junction. These electric charges pass the bonding pad 164, the bump 464, and the bonding pad 264 of the second substrate 200, and are fed to the input terminal of the integrating circuit 20 by way of the switch SW1 formed on the second substrate 200.

The photodetector 1 in accordance with this embodiment constructed as in the foregoing can exhibit the following effects. Namely, the electric charge migration path from each photodiode PD$_{m,n}$ to the input terminal of the integrating circuit 20$_m$ becomes shorter, so that the parasitic capacitance in the wiring on the path becomes smaller, which reduces the noise included in the voltage outputted from the integrating circuit 20$_m$, thereby making it possible to detect light accurately. Since circuits for signal processing such as the integrating circuit 20$_m$ are not provided on the first substrate 100, an increase in the number of pixels or a higher density can be achieved. Also, the second substrate 200 can be made smaller than the first substrate 100, so that, when arranging a plurality of photodetectors 1, the first substrates 100 each provided with a photodiode can be arranged very close to each other or in contact with each other. It is also favorable in that respective optimal processes can be employed for the first substrate 100 formed with a photodiode array and the second substrate 200 formed with a signal processing circuit such as the integrating circuit 20$_m$.

Figure 10A:
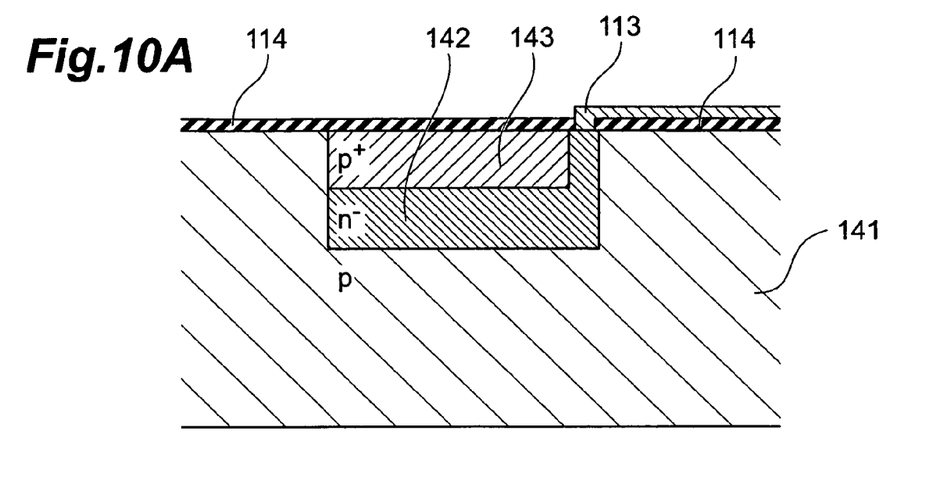
FIG. 10A is an explanatory view of a first example of buried photodiode.
Figure 10B:
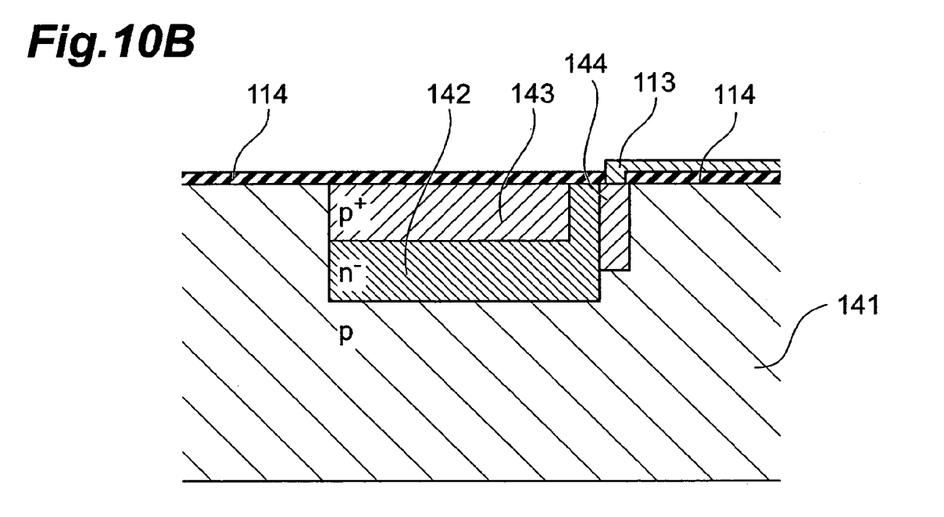
FIG. 10B is an explanatory view of a second example of buried photodiode.

Though each photodiode has a general configuration in FIGS. 8 and 9 explained in the foregoing, buried photodiodes such as those shown in FIGS. 10A and 10B are also favorable.

The buried photodiode whose cross-sectional configuration is shown in FIG. 10A includes a p region 141, an n$^-$ region 142 on the p region 141, and a p$^+$ region 143 on the n$^-$ region 142. The p region 141 and n$^-$ region 142 form a pn junction, whereas the n$^-$ region 142 and p$^+$ region 143 also form a pn junction. The n$^-$ region 142 is electrically connected to the metal lead 113.

The buried photodiode whose cross-sectional configuration is shown in FIG. 10B includes a p region 141, an n$^-$ region 142 on the p region 141, a p$^+$ region 143 on the n$^-$ region 142, and an n$^+$ region 144 in contact with the n$^-$ region 142. The p region 141 and n$^-$ region 142 form a pn junction, whereas the n$^-$ region 142 and p$^+$ region 143 also form a pn junction. The n$^-$ region 142 is electrically connected to the metal lead 113. The p region 141 and n$^-$ region 142 form a pn junction, whereas the n$^-$ region 142 and p$^+$ region 143 also form a pn junction. The n$^+$ region 144 is electrically connected to the metal lead 113.

Using a buried photodiode as such is also effective in improving the S/N ratio of light detection in that leak currents are restrained from generating. Since the photodiode can completely be depleted by increasing the reverse bias voltage thereof in the second period during which the integral capacitance part 21 of the integrating circuit 20$_m$ accumulates electric charges, the junction capacitance value in the photodiode can be made substantially zero, which is also effective in improving the S/N ratio and speed of light detection.

Without being restricted to the above-mentioned embodiment, the present invention can be modified in various manners. For example, the cross-sectional structures of the first substrate 100 and second substrate 200 are not restricted to those shown in FIGS. 8 and 9. Other circuits may also be provided on the second substrate 200. The number of thresholds for determining the electric charge amount level in the electric charge amount level determining circuit 10$_{m,n}$ is arbitrary. Depending on this number, the number of cases of capacitance values attainable by the integral capacitance part of the integrating circuit 20$_m$ is determined.

INDUSTRIAL APPLICABILITY

In the present invention, as explained in detail in the foregoing, the value of reverse bias voltage applied to the photodiode is made greater in the second period during which the integral capacitance part of the integrating circuit accumulates electric charges than in the first period during which the junction capacitance part of the photodiode accumulates elec-

The invention claimed is:

1. A photodetector comprising:

a photodiode having an anode terminal and a cathode terminal between which a reverse bias voltage is applied, generating an electric charge by an amount corresponding to an incident light intensity, and accumulating the electric charge into a junction capacitance part;

an integrating circuit having an input terminal connected to the photodiode by way of a switch, inputting the electric charge accumulated in the junction capacitance part to the input terminal, accumulating the electric charge into an integral capacitance part, and outputting a voltage corresponding to an amount of the accumulated electric charge; and reverse bias voltage changing means for making the value of reverse bias voltage applied to the photodiode greater in a second period during which the integral capacitance part of the integrating circuit accumulates the electric charge than in a first period during which the junction capacitance part of the photodiode accumulates the electric charge wherein the integrating circuit includes an amplifier having a first input terminal corresponding to the input terminal of the integrating circuit, a second input terminal, and an output terminal, and the integral capacitance part is provided between the first input terminal and output terminal.

2. The photodetector according to claim 1, wherein the reverse bias voltage changing means changes the value of reverse voltage applied to the photodiode via the input terminal by altering a voltage fed to the second input terminal of the amplifier between the first and second periods.

3. The photodetector according to claim 1, wherein the photodiode is of a buried type including a second semiconductor region of a second conduction type arranged on a first semiconductor region of a first conduction type, and a third semiconductor region of the first conduction type arranged on the second semiconductor region, the first and second semiconductor regions forming a pn junction, the second and third semiconductor regions forming a pn junction.

4. The photodetector according to claim 3, wherein the photodiode includes a fourth semiconductor region of the second conduction type, in contact with the second semiconductor region, having a higher impurity content than in the second semiconductor region, and outputs an electric charge from the fourth semiconductor region by an amount corresponding to the incident light intensity.

5. The photodetector according to claim 1, further comprising an electric charge amount level determining circuit for determining a level of the amount of electric charge generated in the photodiode;

wherein the integral capacitance part has a variable capacitance value, and the capacitance value is set according to the level determined by the electric charge amount level determining circuit.

6. The photodetector according to claim 1, wherein one integrating circuit is provided for N photodiodes (N being an integer of 2 or greater).

7. The photodetector according to claim 1, wherein the photodiode is arranged on a first substrate, the integrating circuit is arranged on a second substrate, and the first and second substrates are connected to each other with a bump.

* * * * *